US006437660B1

(12) United States Patent
Sullivan

(10) Patent No.: US 6,437,660 B1
(45) Date of Patent: Aug. 20, 2002

(54) METHOD OF INCREASING BUS PERFORMANCE TO REDUCE SIGNAL PROPAGATION DELAY AND ACHIEVE INCIDENT WAVE SWITCHING

(75) Inventor: Robert C. Sullivan, Stow, MA (US)

(73) Assignee: Hybricon Corporation, Ayer, MA (US)

( * ) Notice: Subject to any disclaimer, the term of this patent is extended or adjusted under 35 U.S.C. 154(b) by 0 days.

(21) Appl. No.: 09/698,587

(22) Filed: Oct. 27, 2000

Related U.S. Application Data

(60) Provisional application No. 60/161,790, filed on Oct. 27, 1999.

(51) Int. Cl.[7] .................................................. H01P 5/12
(52) U.S. Cl. ....................................... 333/100; 361/788
(58) Field of Search ............................ 333/100; 361/788

(56) References Cited

U.S. PATENT DOCUMENTS

| | | | |
|---|---|---|---|
| 3,992,686 A | * 11/1976 | Canning | 333/238 |
| 5,434,861 A | * 7/1995 | Pritty et al. | 370/85.8 |
| 5,696,667 A | 12/1997 | Berding | 361/788 |
| 5,930,119 A | 7/1999 | Berding | 361/788 |
| 6,078,965 A | * 6/2000 | Mellitz et al. | 710/1 |
| 6,239,985 B1 | * 5/2001 | Feraud et al. | 361/788 |

* cited by examiner

*Primary Examiner*—Robert Pascal
*Assistant Examiner*—Dean Takaoka
(74) *Attorney, Agent, or Firm*—Mills & Onello, LLP

(57) ABSTRACT

In a backplane interconnect configuration for use in a high-speed data processing system, a plurality of connector slots include an array of connector terminals. First conductive traces electrically couple at least two terminals of adjacent slots, the terminals being coupled by the first conductive traces to form multiple clusters. Each of the plurality of the clusters are in turn electrically coupled by separate conductive traces to at least one common node. This configuration allows for a reduction in the propagation delay of signals propagating between connector slots.

7 Claims, 2 Drawing Sheets

METHOD OF INCREASING BUS PERFORMANCE TO REDUCE SIGNAL PROPAGATION DELAY AND ACHIEVE INCIDENT WAVE SWITCHING

Related Applications

This application claims the benefit of United States Provisional Application Number 60/161,790, filed Oct. 27, 1999

BACKGROUND OF THE INVENTION

Modern electronic systems contain electronic backplanes, also referred to as motherboards, that serve as a communication medium for the exchange of electronic signals between a plurality of daughter cards. The daughter cards generate and receive communication signals, for example data signals, address signals, and control signals which are distributed to daughter card connectors mounted on one or both sides of each daughter card. The daughter cards register with a corresponding set of backplane connectors on the backplane, which in turn distribute the signals between daughter cards along various communication paths. These paths, collectively, are referred to in the art as a bus.

In a standard backplane, for example a VME configuration, the connectors are configured in card slots which are relatively closely spaced, for example 0.8 inches apart. The conductive paths, or "traces", are commonly formed on the motherboard along the shortest distance between adjacent connectors. A group of traces is referred to in the art as a bus. The characteristic impedance of a trace in such a configuration is generally in the 50–65 ohm range. When daughter cards are inserted in the various connectors (with associated traces and capacitive loads on the daughter cards), the signal propagation of the bus is affected, lowering the effective characteristic impedance, for example, to approximately 24 ohms. If the bus is driven from a middle slot, the characteristic impedance is divided further (24 ohms to the left and 24 ohms to the right of the middle slot), resulting in a 12 ohm effective impedance as seen by the bus driver in the middle slot. Standard drivers provided on modern daughter cards are incapable of driving such a low impedance. This leads to ringing and other anomalies on the backplane bus, potentially rendering the transmitted signal undecipherable.

A common technique for mitigating this effect is referred to as "star bus" topology as disclosed in U.S. Pat. Nos. 5,696,667, and 5,930,119, issued Dec. 9, 1997 and Jul. 27, 1999 respectively, both being incorporated herein by reference. In this topology, all backplane slots are connected to a common node at the center slot.

The star bus topology is a viable alternative to the standard bus structure. The advantages of such a topology include a lower propagation time from one end of the bus to the other, as compared to the conventional bus topology. This is due to the fact that the individual transmission lines do not experience the reduced propagation velocity experienced by conventional busses. Furthermore, the large capacitance at the common node slows the rise time, resulting in reduced crosstalk, and reducing ripple by operating as a low-pass filter. However, the total conductor path length on the backplane of the star bus is much longer than the standard bus configuration. For example, for a 21 slot VME backplane, the conductor path is at least 88 inches in the star bus topology configuration, as compared with 16 inches for the standard VME bus configuration. The extra path length translates directly to additional capacitance and inductance that must be charged or discharged during a change of bus state. This results in slower rise and fall times, limiting performance. Strong drivers are required to supply adequate current to rapidly charge or discharge the capacitance, and power dissipation in the drivers is very high. Simulations demonstrate that a standard ABTE driver, well known in the art, is capable of driving the star bus, however in this configuration, the ABTE driver supplies more than its rated current. The output transistor of the driver is thus pulled out of saturation, increasing power dissipation in the transistor. Therefore, drivers with higher current rating and higher power ratings should be used with the star bus. Furthermore, the additional conductor path length on the star bus renders mechanical layout of the backplane more difficult, and requires additional board layers, increasing cost. The resonant circuit formed by the inductance of the driving line and the equivalent capacitance at the common node tends to cause overshoot, and the rise and fall times are determined, at least in part, by this resonance. However, simulation indicates that the overshoot can be controlled by biased Schottky diodes which are required at the common node.

A conventional bus architecture, for example VME, experiences limiting factors that strain the operating frequency. A first limitation arises from the fact that the bus is not terminated at or near its effective characteristic impedance. The effective characteristic impedance of a fully loaded VME backplane with 60-ohm trace impedance is approximately 24.6 ohms. The standard VME terminating impedance of the bus is 190 ohms, resulting in a reflection coefficient $\Gamma$ of:

$$\Gamma=(Z_T-Z_0)/(Z_T+Z_0)=(190-24.6)/(190+24.6)=0.77$$

This means that the magnitude of the reflected signal is 77% of the magnitude of the incident signal. The voltage at the end of the bus is the sum of the incident and reflected voltages causing the output voltage to jump to 77% above the voltage of the incident wave.

To overcome this obstacle, others have provided active clipping diodes connected to both ends of the bus as an effective technique for reducing the signals reflected from the terminations. The idea is to connect a diode clipping circuit that clips at a voltage just above the incident wave voltage to each end of the bus. When an incident wave reaches the end of the bus, the voltage at the termination normally would become the sum of the incident and reflected wave voltages. If the diode clipper limits the terminating voltage to precisely the incident wave voltage, it forces the magnitude of the reflected wave to zero. In practice it is not possible to clip at exactly the incident wave voltage, and thus there will be some reflected signal, but the reflected wave can be significantly reduced.

An additional limitation of conventional backplane architecture lies in the fact that the weak process driver is inadequate for driving the bus. Consider a 21-slot bus being driven from the bus center, for example middle slot 11. The driver is connected to the bus through a stub and connector. If the propagation delay through the stub and connector is short compared to the rise time, the driver essentially sees the effective characteristic impedance of two busses in parallel. If the effective characteristic impedance of the bus is 24 ohms, the driver initially sees approximately half of this, or 12 ohms. This impedance remains approximately constant for the time it takes a signal to propagate to the end of the bus and back to the center. For example, assuming a 3.0 volt pulse source driver with a source resistance of 12 ohms, the initial voltage at the input to the bus is 1.5 volts and the driver supplies 125 mA of current. This is a realistic example because the weak-process ABTE driver is capable of sinking about 120 mA of current. As a result, the voltage waveform at the bus input will exhibit a 'shelf' or 'shoulder' where the voltage remains approximately constant at about 1.5 volts for the roughly 8 ns propagation delay of the bus. This shelf was present in all simulations that use the weak-process ABTE driver at the center of the bus. Except for a very small delay, the output voltage at the slot nearest the driver exhibits a shelf that is very similar to the shelf on the driver output. The effect of the shelf is an uncertainty of as much as 8 ns in the switching time of the receiver, depending upon whether the shelf falls just below or just above the switching threshold of the receiver. When the bus is driven from the end, less current is required from the driver because the driver sees a higher impedance than it sees when driven from the center slot. The resulting impedance for this condition consists of the effective bus impedance in parallel with the 190 ohm terminating resistor.

SUMMARY OF THE INVENTION

The present invention is directed to a technique for improving the operating speed of a backplane bus, for reducing the propagation delay of the backplane bus, and for reducing power levels dissipated in the bus drivers. Trace configurations provided by the present invention allow for substantial increase in bus performance.

The present invention further proposes a novel technique for increasing bus performance via the use of clustering of conductive traces of adjacent terminals.

In a first embodiment, the present invention is directed to a backplane interconnect configuration for use in a high-speed data processing system. The interconnect configuration comprises a plurality of connector slots, each slot including an array of connector terminals. First conductive traces electrically couple at least two terminals of adjacent slots, the terminals being coupled by the first conductive traces, defining a cluster. Each of a plurality of the clusters are in turn electrically coupled by separate second conductive traces to at least one common node. This configuration allows for a reduction in the propagation delay of signals propagating between connector slots.

In a preferred embodiment, the terminals of the same cluster are electrically coupled by the first conductive traces formed along the shortest distance between the terminals. Each cluster preferably includes a cluster node at a central position within each cluster, each cluster being electrically coupled to the common node by the second conductive traces between the common node and the cluster node. Each cluster may alternatively include a cluster node at an end position of the cluster. Terminals of the same cluster may alternatively be electrically coupled by the first conductive traces of equal length arranged in a star topology.

In a second preferred embodiment, the second conductive traces may include series isolating resistors. The series isolating resistors provide sufficient isolation to allow for clean incident wave propagation at neighboring slots within a cluster, and further minimize propagation delay of signals between clusters. The series isolating resistors may be located along the second conductive traces proximal to the common node, or proximal to the clusters.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

The present invention is directed to a technique for improving the operating speed of a backplane bus, for reducing the propagation delay of the backplane bus, and for reducing the power dissipated in the bus drivers.

Figure 1:
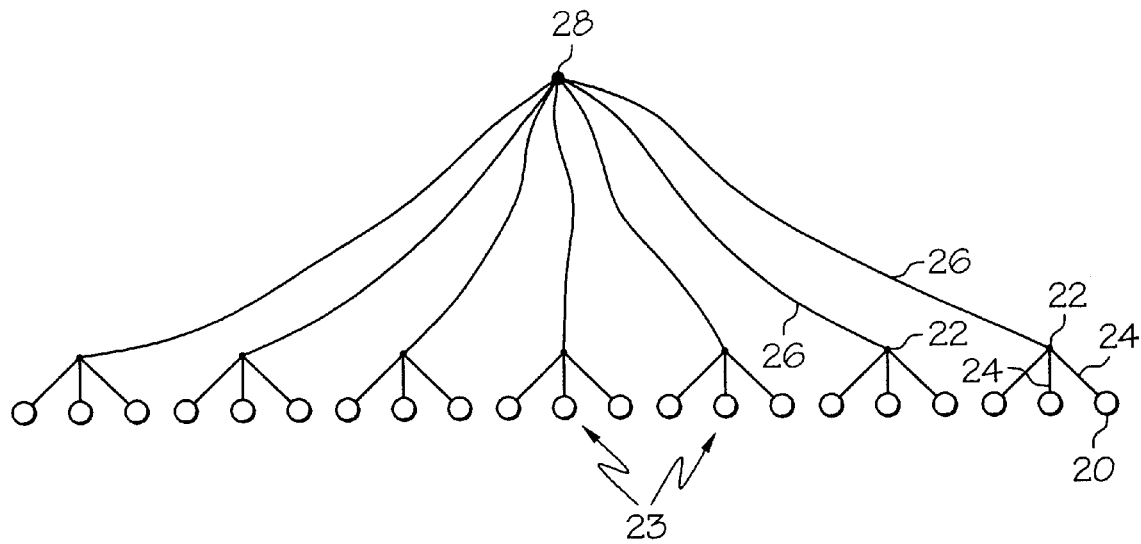
FIG. 1 is a schematic diagram of a cluster topology in accordance with the present invention.

With reference to FIG. 1, in a first preferred embodiment, multiple terminals of groups of slots (typically 3 to 4 slots) represented by circles 20 are clustered together in a small bus or localized cluster by first interconnects 24 and intersect at a cluster node 22. Clusters 23 are in turn connected together in a "star" topology via second interconnects 26 to a common node 28. The advantage of this approach is that the use of clustering results in approximately ⅓ to ½ as many traces as the conventional "star" approach of the Berding et al. patents described above, resulting in lower cost and more readily manufacturable backplanes. The present invention further exhibits lower trace capacitance, as it employs roughly 40 inches of trace length for a typical VME backplane, as compared to roughly 88 inches of trace for the "star" approach. This approach is suitable for applications that do not require incident wave switching, and provides minimum propagation delay for these cases.

Figure 3:
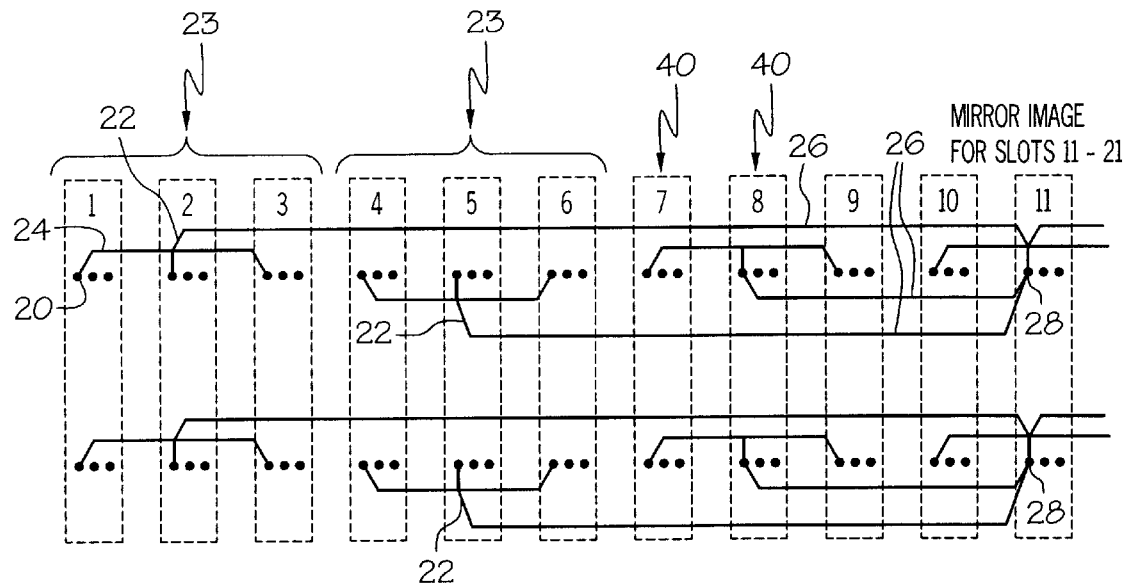
FIG. 3 is a layout diagram of a backplane utilizing the cluster topology of the present invention.

It can be seen in the layout diagram of FIG. 3 that the overall trace length is drastically reduced, as compared to the "star" approach. Rather than utilizing second interconnects 26 to connect the common node 28 at slot 11 to each and every individual slot 40, the present invention utilizes the second interconnects 26 to deliver signal from the central node 28 to the cluster nodes 22, which, in turn, distribute the signals to the individual slots 40 via the first interconnects 24. The first interconnects in turn serve to connect each cluster node 22 to its respective slot terminals 20.

Figure 2:
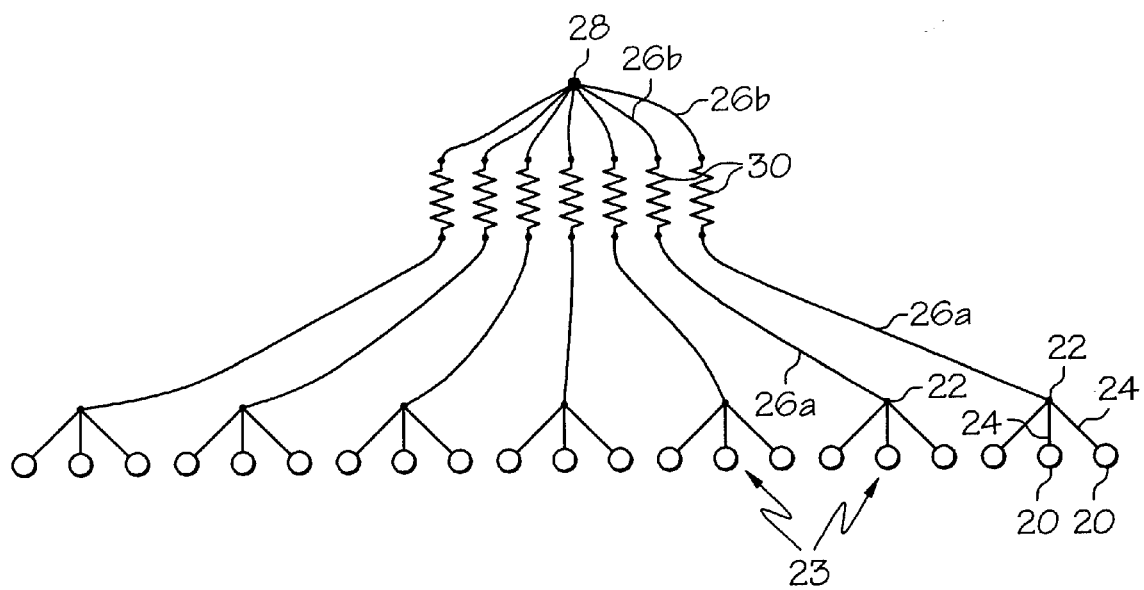
FIG. 2 is a schematic diagram of a cluster topology with intermediate termination resistors in accordance with the present invention.

With reference to FIG. 2, in a second preferred embodiment, intermediate series termination resistors 30 are provided in series along the second traces 26a, 26b. The innovative addition of the intermediate resistors 30, preferably of a small resistance value, for example 10 to 20 ohms, serves to partially isolate each cluster 23 from other clusters, allowing for fast, clean transitions through the threshold region at neighboring slots within a cluster 23. Slots 20 in other clusters 23 will experience a slower rise time due to the RC filtering effect of the middle termination resistors operating against the capacitance of the traces associated with each cluster, allowing for slower, clean transitions through the threshold region at the receivers in the other clusters.

Figure 4:
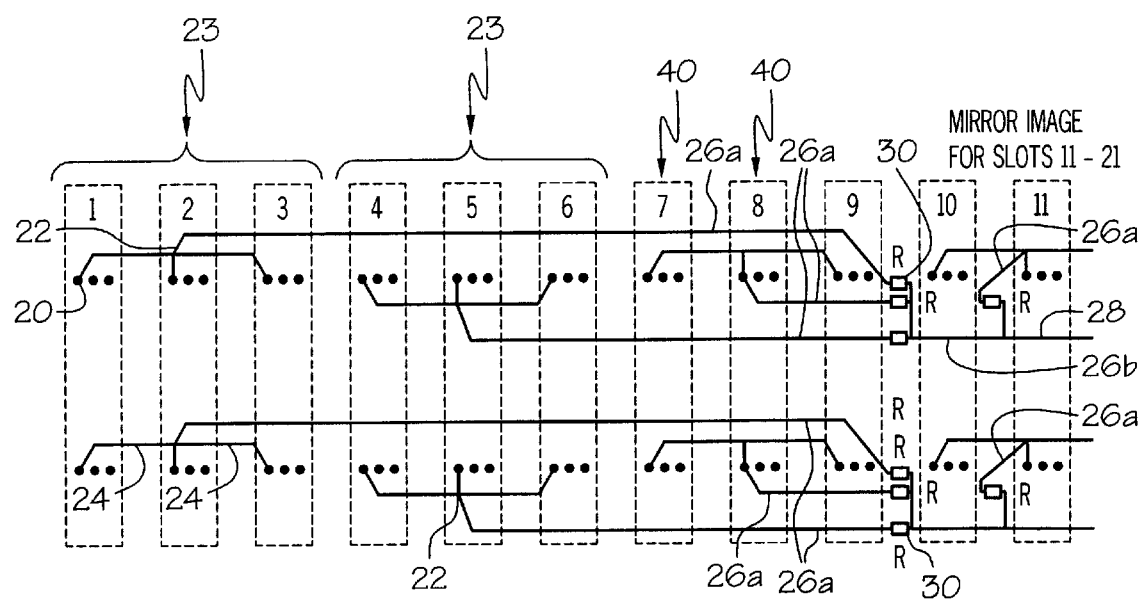
FIG. 4 is a layout diagram of a backplane utilizing the cluster topology of the present invention, with intermediate termination resistors.

FIG. 4 is similar to FIG. 3, with the addition of the intermediate resistors R 30 distributed along the second interconnect traces 26, for example between trace portions 26a and 26b, as described above.

The cluster nodes 22 in either configuration may be positioned at a central location with respect to the first conductive traces 24 from the other terminals 20 sharing a cluster 23, or alternatively may be positioned at an end location.

While this invention has been particularly shown and described with references to preferred embodiments thereof, it will be understood by those skilled in the art that various changes in form and details may be made therein without departing from the spirit and scope of the invention as defined by the appended claims.

I claim:

1. A backplane interconnect configuration for use in a high-speed data processing system comprising:

a plurality of connector slots, each slot including an array of connector terminals; and first conductive traces for electrically coupling at least two terminals of adjacent slots; said terminals coupled by said first conductive traces, defining a cluster; each of a plurality of said clusters being in turn electrically coupled by separate second conductive traces to at least one common node, so as to reduce the propagation delay of signals propagating between connector slots, the second conductive traces including series isolating resistors between the clusters and the at least one common node.

2. The interconnect configuration of claim 1 wherein terminals of the same cluster are electrically coupled by said first conductive traces formed along the shortest distance between the terminals.

3. The interconnect configuration of claim 2 wherein each cluster includes a cluster node at a central position within the cluster, each cluster being electrically coupled to the at least one common node by said second conductive traces between the common node and the cluster node.

4. The interconnect configuration of claim 2 wherein each cluster includes a cluster node at an end position of the cluster, each cluster being electrically coupled to the at least one common node by said second conductive traces between the common node and the cluster node.

5. The interconnect configuration of claim 1 wherein terminals of the same cluster are electrically coupled by said first conductive traces of equal length arranged in a star topology.

6. The interconnect configuration of claim 1 wherein the series isolating resistors are located along the second eonductive traces proximal to the clusters.

7. The interconnect configuration of claim 1 wherein the series isolating resistors are located along the second conductive traces proximal to the common node.

* * * * *